United States Patent [19]

Ye et al.

[11] Patent Number: 6,153,530
[45] Date of Patent: Nov. 28, 2000

[54] POST-ETCH TREATMENT OF PLASMA-ETCHED FEATURE SURFACES TO PREVENT CORROSION

[75] Inventors: Yan Ye, Campbell; Xiaoye Zhao, Mountain View; Chang-Lin Hsieh, Sunnyvale, all of Calif.; Xian-Can Deng, Hangzhou, China; Wen-Chiang Tu, Mountain View, Calif.; Chung-Fu Chu, Cupertino, Calif.; Diana Xiaobing Ma, Saratoga, Calif.

[73] Assignee: Applied Materials, Inc., Santa Clara, Calif.

[21] Appl. No.: 09/270,286

[22] Filed: Mar. 16, 1999

[51] Int. Cl.$^7$ .................................................. H01L 21/00
[52] U.S. Cl. ......................... 438/720; 438/734; 438/742
[58] Field of Search ................... 438/710, 712, 438/716, 720, 734, 742; 216/67, 78

[56] References Cited

U.S. PATENT DOCUMENTS

| | | | |
|---|---|---|---|
| 4,668,335 | 5/1987 | Mockler et al. | 156/643 |
| 4,985,113 | 1/1991 | Fujimoto et al. | 438/720 X |
| 5,186,718 | 2/1993 | Tepman et al. | 29/25.01 |
| 5,200,031 | 4/1993 | Latchford et al. | 156/659.1 |
| 5,244,535 | 9/1993 | Ohtsuka et al. | 156/643 |
| 5,302,241 | 4/1994 | Cathey, Jr. | 156/664 |

FOREIGN PATENT DOCUMENTS

| | | | |
|---|---|---|---|
| 61-041775 | 2/1986 | Japan | C23C 18/40 |
| 6-232093 | 8/1994 | Japan | H01L 21/302 |

OTHER PUBLICATIONS

Andreas Bertz, et al., "Effects of the biasing frequency on RIE of Cu in a $Cl_2$–based discharge" *Applied Surface science*, 91 (1995) pp. 147–151.

C. Steinbruchel, "Patterning of copper for multilevel metallization: reactive ion etching and chemical–mechanical polishing",*Applied Surface Science*, 91(1995), pp. 139–146.

Harold F. Winters, "The etching of Cu(100) with $Cl_2$", *J. Vac. Sci. Technol.* A, 3(3) (May/Jun. 1985), pp. 786–790.

Yan Ye et al., "o.35–Micron and Sub–0.35–Micron Metal Stack Etch in a DPS Chamber—DPS Chamber and Process Characterization" *Electrochemical Society Proceedings*, vol. 96–12 (1996), pp. 222–233.

C. Steinbruchel, "Patterning of copper for multilevel metallization: reactive ion etching and chemical–mechanical polishing", *Applied Surface Science*, 91 (1995), pp. 139–146.

Harold F. Winters, "The etching of Cu(100) with $Cl_2$", *J. Vac. Sci. Technol.* A, 3(3) (May/Jun. 1985), pp. 786–790.

(List continued on next page.)

*Primary Examiner*—William Powell
*Attorney, Agent, or Firm*—Shirley L. Church

[57] ABSTRACT

Disclosed herein is a post-etch treatment for plasma etched metal-comprising features in semiconductor devices. The post-etch treatment significantly reduces or eliminates surface corrosion of the etched metal-comprising feature. It is particularly important to prevent the formation of moisture on the surface of the feature surface prior to an affirmative treatment to remove corrosion-causing contaminants from the feature surface. Avoidance of moisture formation is assisted by use of a high vacuum; use of an inert, moisture-free purge gas; and by maintaining the substrate at a sufficiently high temperature to volatilize moisture. The affirmative post-etch treatment utilizes a plasma to expose the etched metal-comprising feature to sufficient hydrogen which is in a kinetic state permitting reaction with residual halogen-comprising residues on the etched surface, while maintaining the etched feature surface at a temperature which supports volatilization of the byproducts of a reaction between the active hydrogen species and the halogen-comprising residues. For an etched copper surface, if moisture forms on the etched surface prior to an affirmative treatment to remove corrosion-causing contaminants, it is very important to avoid contact of the etched surface with pollutants which are capable of forming copper carbonates and/or copper sulfates.

30 Claims, 6 Drawing Sheets

OTHER PUBLICATIONS

Yan Ye et al., "o.35–Micron and Sub–0.35–Micron Metal Stack Etch in a DPS Chamber—DPS Chamber and Process Characterization" *Electrochemical Society Proceedings*, vol. 96–12 (1996), pp. 222–233.

U.S. Patent Application, Serial No. 08/869,798, of Ye et al., filed Jun. 5, 1997–093–156/345 (issue) Loc 7540.

U.S. Patent Application, Serial No. 08/891,410, of Ye et al., filed Jul. 9, 1997–6,010,603–204/192.350.

U.S. Application, Serial No. 08/911,878, of Ye et al., filed Aug. 13, 1997–6,008,140–435/742.

U.S. Patent Application Serial No. 09/042,146 of Ma, filed Mar. 13, 1998–5,968,847–438/734 Powell.

U.S. Patent Application, Serial No. 09/130,893, of Ye et al., filed Aug. 7, 1998–030–438/710 George Loc 1765, chg loc17X1.

U.S. Patent Application, Serial No. 09/158,563, of Ye et al., filed Sep. 22, 1998–071–156/345 Loc 17D6, chg Loc17X1.

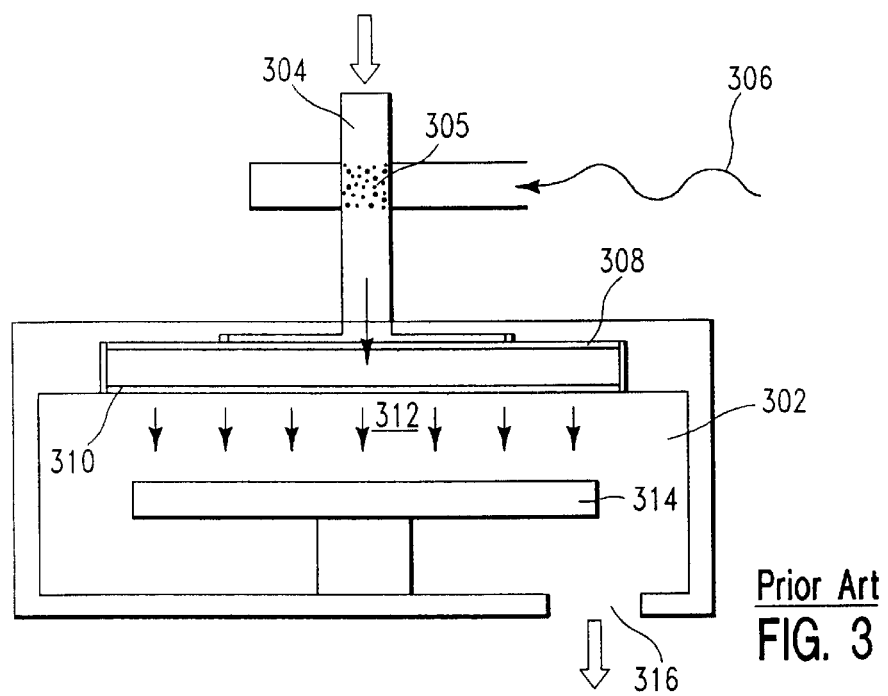
Prior Art
FIG. 3
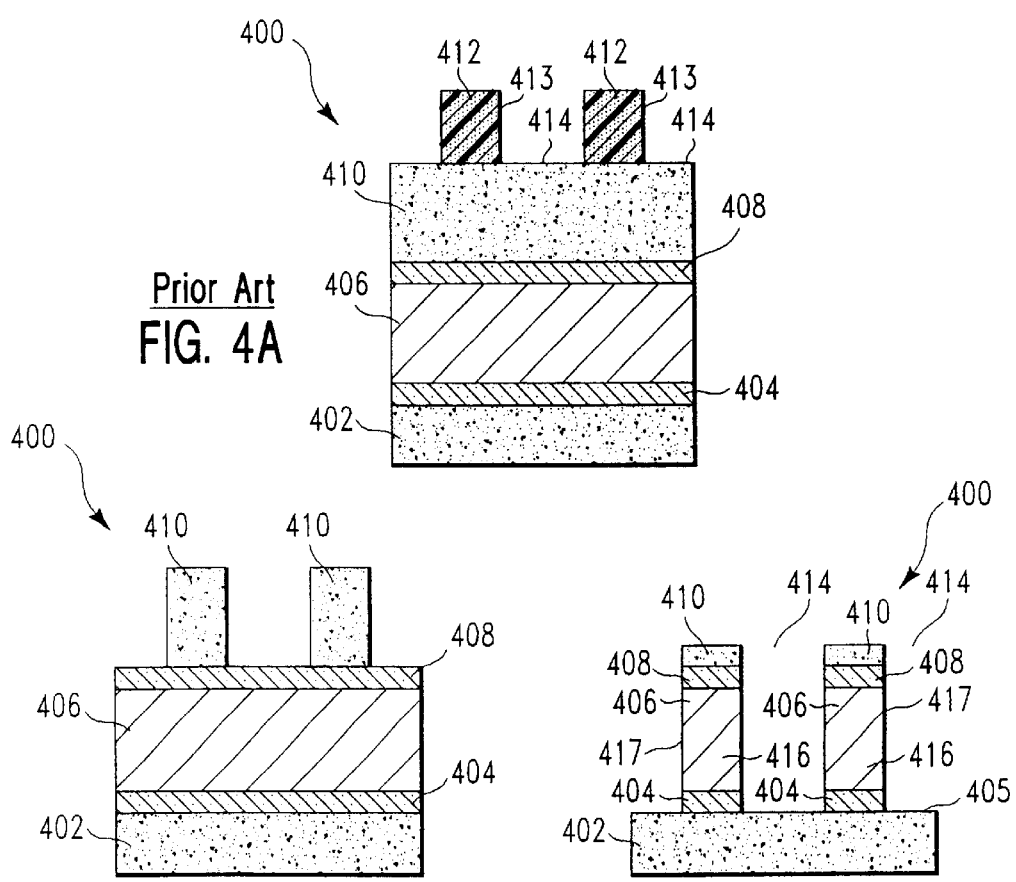
Prior Art
FIG. 4A
FIG. 4B Prior Art
FIG. 4C Prior Art

POST-ETCH TREATMENT OF PLASMA-ETCHED FEATURE SURFACES TO PREVENT CORROSION

BACKGROUND OF THE INVENTION

1. Field of the Invention

The present invention pertains to semiconductor device fabrication and to a method for the post-etch treatment of etched metal-comprising features, to prevent corrosion of the etched feature surface.

2. Brief Description of the Background Art

In the multi level metallization architecture used in present day semiconductor devices, aluminum is generally used as the material of construction for interconnect lines and contacts. Although aluminum offers a number of advantages in ease of fabrication, as integrated circuit designers focus on transistor gate velocity and interconnect line transmission time, it becomes apparent that copper is the material of choice for the next generation of interconnect lines and contacts. The resistivity of copper is about 1.4 $\mu\Omega$cm, which is only about half of the resistivity of aluminum.

There are two principal competing technologies under evaluation by material and process developers working to enable the use of copper. The first technology is known as damascene technology. In this technology, a typical process for producing a multilevel structure having feature sizes in the range of 0.5 micron ($\mu$m) or less would include: blanket deposition of a dielectric material; patterning of the dielectric material to form openings; deposition of a diffusion barrier layer and, optionally, a wetting layer to line the openings; deposition of a copper layer onto the substrate in sufficient thickness to fill the openings; and removal of excessive conductive material from the substrate surface using chemical-mechanical polishing (CMP) techniques. The damascene process is described in detail by C. Steinbruchel in "Patterning of copper for multilevel metallization: reactive ion etching and chemical-mechanical polishing", *Applied Surface Science* 91 (1995) 139–146.

A particular problem with the damascene process is that the CMP techniques used to remove excess copper from the dielectric surface after deposition create problems. Copper is a soft material which tends to smear across the underlying surface during polishing. "Dishing" of the copper surface may occur during polishing. As a result of dishing, there is variation in the critical dimensions of conductive features. Particles from the slurry used during the chemical mechanical polishing process may become embedded in the surface of the copper and other materials surrounding the location of the copper lines and contacts. The chemicals present in the slurry may corrode the copper, leading to increased resistivity and possibly even corrosion through an entire wire line thickness. Despite the number of problems to be solved in the damascene process, this process has been viewed in the industry as more likely to succeed than a patterned copper etch process, because of the difficulty in preventing the corrosion of copper both during the etch process and post etch, during subsequent processing.

The competing technology is one which involves the patterned etch of a copper layer. In this technology, a typical process would include deposition of a copper layer on a desired substrate (typically a dielectric material having a barrier layer on its surface); application of a patterned hard mask or photoresist over the copper layer; pattern etching of the copper layer using wet or dry etch techniques; and deposition of a dielectric material over the surface of the patterned copper layer, to provide isolation of conductive lines and contacts which comprise various integrated circuits. An advantage of the patterned etch process is that the copper layer can be applied using sputtering techniques well known in the art. The sputtering of copper provides a much higher deposition rate than the evaporation or CVD processes typically used in the damascene process, and provides a much cleaner, higher quality copper film than CVD. Further, it is easier to etch fine patterns into the copper surface and then deposit an insulating layer over these patterns than it is to get the barrier layer materials and the copper to flow into small feature openings in the top of a patterned insulating film.

However, patterned etch of a copper layer is more difficult than patterned etch of an aluminum layer, due to the chemical and physical properties of the copper film. For example, although copper reacts with chlorine at low temperature as aluminum does, the product of the reaction is not as volatile as the reaction product with aluminum. This causes copper film to corrode rather than etch when subjected to conditions similar to those used to etch aluminum. An undesired reaction can easily extend to a location within a copper layer. In fact, copper features have been observed to have smooth sidewalls outside but to have corroded interiors. To prevent the interior corrosion of pattern-etched copper films, we first developed methods of protecting the etched copper surface of copper features during the etch process. These methods are described in the following patent applications: U.S. Ser. No. 08/891,410 of Ye et al., titled "Patterned Copper Etch For Micron And Submicron Features Using Enhanced Physical Bombardment", filed Jul. 9, 1997; U.S. Ser. No. 08/911,878 of Ye et al., titled "Copper Etch Using HCl and HBr Chemistry", filed Aug. 13, 1997; U.S. Ser. No. 09/042,146 of Ye et al. titled "Process For Copper Etch Back", filed Mar. 13, 1998; and U.S. Ser. No. 09/130,893 of Ye et al., titled "Method Of Etching Copper For Semiconductor Devices", filed Aug. 7, 1998. The subject matter of these applications is hereby incorporated by reference in its entirety.

Although we were able to obtain etched copper features which exhibited minimal to no corrosion at the end of the etch process, we discovered that corrosion could occur during subsequent device processing steps. In order to achieve good electrical critical dimension (ECD) control and electro migration (EM) control, the etched copper features must be kept free of corrosion, including oxidation, must be prevented. We began work to determine how best to protect the etched copper surface until such time that a protective layer or coating is applied over the copper surface during subsequent processing steps which typically follow a pattern etching step.

Others working in the art have tried various methods of treating the copper surface after pattern etching to remove contaminants from the copper surface which were viewed as causing post-etch corrosion of the copper. Harold F. Winters, in his article "The etching of Cu(100) with $Cl_2$, J. Vac. Sci. Technol. A3(3), May/June 1985, pp. 786–790, describes etch products, surface chemistry and product desorption mechanisms for interaction of $Cl_2$ with Cu(100). The dominant etch product is said to be $Cu_3Cl_3$ when the substrate temperature is less than about 580° C. and CuCl when the substrate temperature is greater than 650° C. Exposure of Cu(100) to $Cl_2$ at temperatures below 150° C. is said to lead to the growth of a copper chloride layer whose thickness increases linearly with time for exposures greater than approximately 1000 langmuirs. The rate of growth of the chloride layer decreases with increasing temperature. The chloride is said to desorb as $Cu_3Cl_3$, with zero order kinetics.

The zero order kinetics suggest that the quantity of chlorine on the immediate surface remains constant until the chlorine in the bulk is depleted. The author concludes that etching is simply a "compound growth"—evaporation reaction. Ion bombardment is said to suppress the etch rate which is thought to be a consequence of ion-induced dissociation of $Cu_3Cl_3$ and possibly a decreased concentration of chlorine in the surface region.

An example of the surface treatment of copper to prevent corrosion is provided in Japanese Patent Application No. 61041775A, published on Feb. 28, 1986. The abstract for this application discloses a surface treatment of copper using an aqueous solution containing copper ions, chelating agent, reducing agent, hydroxide ions and at least one zirconia and/or bismuth compound.

Another example of a treatment to remove chlorides and fluorides remaining after the etch of a conductive layer is provided in U.S. Pat. No. 4,668,335 to Mockler et al., issued May 26, 1987. In Mockler et al., the preferred embodiments pertain to the etching of aluminum, aluminum-copper, and aluminum-copper-silicon alloys. After the etch step, the workpiece (wafer) is immersed in a strong acid solution, followed by a weak base solution after the etch of an aluminum-copper alloy, to remove residual chlorides and fluorides remaining on the etched surface.

A further example of the removal of corrosive materials from the etched surface is provided in U.S. Pat. No. 5,200,031 to Latchford et al., issued Apr. 6, 1993. In Latchford et al, a process is described for removing a photoresist remaining after one or more metal etch steps which also removes or inactivates chlorine-containing residues, to inhibit corrosion of remaining metal for at least 24 hours. The etched metal layer is said to comprise aluminum, titanium, tungsten, etc. The integrated circuit structure (wafer) is said to be removed from the metal etch chamber and placed in a vacuum stripping chamber, unless the same chamber is to be used for both processes. The wafer temperature, as it emerges from the metal etch chamber is described as being about 100° C. The wafer temperature during the stripping process is maintained within a range of from about. 100° C. to about 400° C., preferably from about 200° C. to about 300° C. When the wafer entering the stripping process is at 100° C. and it is desired to carry out the stripping process at a higher temperature, the wafer temperature may be ramped up to the desired temperature at a rate of about 10° C. per second while the first stripping step is being carried out. In the first stripping step, $NH_3$ gas is flowed through a microwave plasma generator into a stripping chamber containing the workpiece; in the second stripping step, $O_2$ gas (and optionally $NH_3$ gas), is flowed through the microwave plasma generator into the stripping chamber.

U.S. Pat. No. 5,244,535 to Ohtsuka et al., issued Sep. 14, 1993, describes a method for making a semiconductor device which includes formiing of an insulation layer on top of a conduction layer adhered to a semiconductor substrate; forming contact holes by etching the insulation layer with a fluorine-based gas; and converting a gas containing nitrogen to a plasma and using the obtained plasma to treat at least the aforementioned contact holes. In particular, the conductive layer is an aluminum alloy (containing 2% copper); the post-etch plasma treatment of the conductive layer surface is conducted with a nitrogen gas plasma at a temperature of about 12° C. for a period of about 15 seconds, after which the substrate is exposed to air.

U.S. Pat. No. 5,302,241 to Cathey, Jr., issued Apr. 12, 1994, describes the post etching treatment of semiconductor devices. After the etching of a semiconductor device, prior to removing the etched semiconductor from the etching area, a passivating agent comprising silicon tetrafluoride is introduced into the etching area. The passivating agent reacts with any reactive chemical compound associated with the semiconductor to inhibit corrosion of the semiconductor device. The inhibited reactive chemical composition, which is typically in the gas phase, is then pumped out of the etch area. The preferred embodiment is an aluminum or aluminum alloy layer, where the etchant is a halogen containing material, preferably chlorine gas or HCl, which is said to cause corrosion of the aluminum after it is removed from the etching area. The passivating agent is a gaseous $SiF_4$ plasma, which forms an inhibited reactive chemical compound by replacing the chlorinated products to provide sidewall passivation, where the byproducts of the passivation reaction are then removed from the etching area. There is no mention of the substrate temperature during the post-etch treatment.

Japanese patent application number 9315119A, published Feb. 2, 1993, describes a semiconductor device manufacturing method used in VLSI circuit fabrication which incorporates vacuum storage processing followed by plasma processing by chlorofluoro carbon compound gas.

Andreas Bertz et al. in their article entitled "Effects of the biasing frequency on RIE of Cu in a $Cl_2$-based discharge", Elsevier Applied Surface Science 91-(1995) pp. 147–151 describe the use of sidewall forming additives such as $CH_4$ within the etchant source gas as a means for overcoming a rim-like copper attack at the interface between the masking material and the copper surface. However, the addition of only 4 sccm of $CH_4$ as a sidewall passivating additive is said to have led to a remarkable etch rate reduction due to the deposition of a thin surface-covering film.

Despite the number of methods described in the art for post-etch treatment to reduce corrosion of etched copper features, the corrosion problem remained, to an extent that those skilled in the art considered the damascene process to be the process of choice for the formation of patterned copper features in semiconductor devices. The post-etch treatment method of the present invention reduces or eliminates the corrosion problem on the surface of plasma etched copper features, so that plasma etching becomes the preferred method for the fabrication of patterned copper semiconductor features. In addition, the method is useful for the reduction of corrosion with respect to other plasma-etched metal-comprising features such as aluminum, tungsten, PZT ($Pb(Zr_{1-x} Ti_x)O_3$, and BST $(Ba,Sr)TiO_3$, for example, and not by way of limitation.

SUMMARY OF THE INVENTION

We have discovered a post-etch treatment for plasma-etched, metal-comprising feature surfaces which significantly reduces or eliminates surface corrosion of the etched feature. As a part of the post etch treatment, we have determined that it is particularly important to prevent the formation of moisture on the surface of the feature surface prior to an affirmative treatment to remove corrosion-causing contaminants from the feature surface. The moisture forms an acid upon contact with several of the corrosion-causing contaminants. Presence of the acid both enables side reactions which increase the number of modes of corrosion as well as increases the rate of corrosion in many instances. Avoidance of moisture formation is assisted by use of a high vacuum, use of an inert, moisture-free purge gas, and by maintaining the substrate at a sufficiently high temperature to volatilize moisture.

We have also discovered that if moisture does form on the feature surface prior to an affirmative treatment to remove corrosion-causing contaminants, it is very important to avoid contact of the feature surface with pollutants present in the ambient surrounding the etched feature surface. The use of a high vacuum ambient is helpful; the use of an inert purge gas which constantly sweeps the feature surface to prevent pollutants resident in the process environment from contacting the etched surface is also helpful. The avoidance of feature surface contact by pollutants increases the amount of time permissible between the end of the etch step and the beginning of the affirmative post-etch treatment, all other factors held constant.

The post-etch treatment which utilizes a plasma includes exposure of the etched, metal-comprising feature surface to sufficient hydrogen which is in a kinetic state permitting reaction with residual halogen-comprising residues on the etched copper surface, while maintaining the etched feature surface at a temperature which supports volatilization of the byproducts of the reaction between the active hydrogen species and the halogen-comprising residues. The volatilized byproducts are then removed from the vapor space adjacent the etched feature surface. Typically this removal is accomplished by maintaining the post-etch treatment chamber under vacuum, with sufficient flow of dried inert gas (or other passivation gas) across the feature surface that the volatilized byproducts are pulled out of the chamber.

In a preferred embodiment, the metal-comprising material etched is copper. The affirmative post-etch treatment includes the use of a plasma which is preferably applied to the etched feature surface as soon as is reasonably possible after completion of etching. The critical factors are that, prior to post-etch treatment, the formation of moisture upon the etched surface be reduced to a minimum, to avoid the formation of even a monolayer of moisture, if possible; and, that exposure of the etched surface to at least one source which provides carbon and oxygen is avoided. (In avoiding exposure of the etched surface, it is important to understand that the harmful carbon and oxygen each may be present in any form in the ambient surrounding the etched surface, where species containing both carbon and oxygen can be generated from the carbon and oxygen under the conditions present in the ambient or upon the etched surface.) The presence of carbon monoxide and carbon dioxide in the ambient in contact with the etched surface is particularly harmful. The presence of oxides of sulfur is also harmful.

The affirmative post-etch treatment is preferably carried out in the same process chamber in which the feature etching was carried out. This "in situ" post-etch treatment reduces the time between the completion of etching and application of the post-etch treatment, reducing the possibility of corrosion prior to post-etch treatment. The post-etch treatment may also be carried out in a separate passivation chamber, so long as the formation of moisture on the etched feature surface and the exposure to ambient air with its carbon monoxide, carbon dioxide, and other contaminants is minimized. It is also helpful to maintain the flow of a dried, inert gas such as helium, argon, krypton, nitrogen, or xenon over the etched feature surface prior to post-etch treatment.

In general, the post-etch treatment plasma source gas includes hydrogen gas or a hydrogen-containing compound. For example, and not by way of limitation, compounds such as $NH_3$, or $C_x H_y$, where x=1 to 2 and y=2 or more are recommended. When the etched feature surface includes copper, it is particularly important that the plasma source gas not contain a source for oxygen species which can corrode the copper. With this in mind, most preferably, the hydrogen-containing compounds are non-toxic or less toxic and volatile, such as $H_2$, $NH_3$ and $CH_4$. Depending on the metal-comprising composition of the feature surface, $CH_4$ may be added to the plasma source gas toward the end of the treatment, to provide for the formation of a protective polymeric material over the feature surface.

The hydrogen-containing plasma source gas may include at least one noble gas or a gas which is chemically inert, as a diluent which may assist in the dissociation of the hydrogen-containing compound. Examples of such gases include argon, xenon, helium, krypton and neon. Nitrogen may also be used as a diluent which assists in the dissociation of the hydrogen-comprising compound. The minimum amount of power applied to the plasma source gas is that which is sufficient to cause dissociation of the hydrogen or hydrogen-containing compound into reactive hydrogen species. Typically no bias power is applied to the substrate, and in any case the bias power is sufficiently low that the voltage on the substrate surface is less than about 100 eV, to avoid further etching of the etched feature surface. The flow rate of the plasma source gas is typically designed to not only to furnish the reactive hydrogen species, but also to sweep away the by product formed upon reaction of the reactive hydrogen species with halogen-comprising residues present on the etched feature surface.

The method for reducing or avoiding the corrosion of an etched metal-comprising surface of a semiconductor feature includes the following steps:
  a) preventing the formation of corrosion-inducing species on the surface of an etched feature subsequent to substantial completion of etching of the feature and prior to an affirmative post-etch treatment to remove residues on a surface of the etched feature;
  b) contacting the etched feature surface with a plasma including at least one hydrogen-comprising species which is in a kinetic state permitting reaction with residual halogen-comprising residues on the etched feature surface; and
  c) removing the reaction products from step (b) from the etched feature surface.
Step c) above may be followed by an additional step:
  d) applying a deionized water rinse to the etched feature surface.

Step (a) above typically involves prevention of the formation of moisture on a surface of the etched feature. Depending on the ambient surrounding the etched feature surface, step (a) may require the flowing of an inert purge gas across the etched feature surface, to prevent pollutants in the ambient from contacting the etched surface.

In a second embodiment, the post-etch treatment includes contacting the etched feature surface with treatment gases, but without the use of a plasma, as soon as is reasonably possible after completion of etching. The etched feature surface is maintained at a temperature which is sufficient so that hydrogen which is supplied from the treatment gases is in a kinetic state permitting reaction with residual halogen-comprising residues on the etched metal-comprising feature surface (typically a temperature greater than about 200° C.). The feature surface temperature must also be adequate to provide for volatilization of the byproducts of the reaction between the hydrogen-comprising reagents and halogen-comprising residues. The volatilized byproducts are then removed from the vapor space adjacent the etched feature surface. Again, this removal is accomplished by maintaining the post-etch treatment chamber under vacuum, with sufficient flow of dried inert gas across the feature surface that the volatilized byproducts are pulled out of the chamber.

As described with reference to the first embodiment of the invention, the post-etch treatment is preferably carried out in the same process chamber in which the feature etching was carried out; although the post-etch treatment may also be carried out in a separate passivation chamber, so long as the formation of moisture on the etched feature surface and contact with ambient air or similar contaminant materials is avoided. It is particularly helpful in this instance to keep the etched feature surfaces at a temperature adequate to vaporize any moisture which contacts the surface.

The hydrogen in the source gas may be hydrogen gas or a hydrogen-containing compound. Preferably the hydrogen-containing compound does not contain carbon; for example, and not by way of limitation, compounds such as $NH_3$, HI, $NH_2OH$, and combinations thereof are recommended. It is acceptable to use oxygen containing compounds such as water, so long as the compounds do not break down to provide free oxygen species under the post-etch treatment conditions. The hydrogen in the water may react with residues on the etched surface to produce volatile compounds which are removed from the etched surface under the post-etch treatment process conditions. The preferred hydrogen-containing compounds are non-toxic or less toxic and are volatile under process conditions similar to those used during the etching process. Preferred hydrogen-containing compounds, but not by way of limitation, include $H_2$, NH3, or $NH_2OH$.

The second, plasma-free, method for reducing or avoiding the corrosion of an etched metal-comprising surface of a semiconductor feature includes the following steps:

a) preventing the formation of corrosion-inducing species on the surface of an etched feature subsequent to substantial completion of etching of the feature and prior to an affirmative post-etch treatment to remove residues on a surface of the etched feature;

b) contacting the etched feature surface with a gaseous composition containing at least one hydrogen-comprising species under process conditions which are sufficient to permit reaction with residual halogen-comprising residues on the etched feature surface; and c) removing the reaction products of the hydrogen and halogen-comprising residues from the etched feature surface.

Step c) above may be followed by an additional step:

d) applying a deionized water rinse to the etched feature surface.

When the etched feature surface comprises copper, it is critical to ensure that the ambient surrounding the copper subsequent to the substantial completion of etching and prior to the affirmative post-etch treatment is free of pollutants which are capable of forming copper carbonates or copper sulfates.

After one of the post-etch treatments described above, a patterned copper feature can be exposed to an ambient air environment at a relative humidity of about 100% for approximately 3 days without the appearance of surface corrosion which would significantly affect the ability to carry out fabrication steps which follow the patterned copper etch step or performance of the fabricated device.

BRIEF DESCRIPTION OF THE DRAWINGS

FIG. 3 is a cross-sectional schematic of an individual post-etch treatment chamber which includes an external microwave-generated plasma source. This process chamber is representative of an advanced strip and passivation chamber of the kind described with reference to FIG. 1.

FIGS. 4A through 4C show a schematic of a cross-sectional view of a prior art copper etch stack as it processes through a series of process steps in the etching of a pattern of lines and spaces.

DETAILED DESCRIPTION OF THE PREFERRED EMBODIMENTS

Figure 1:
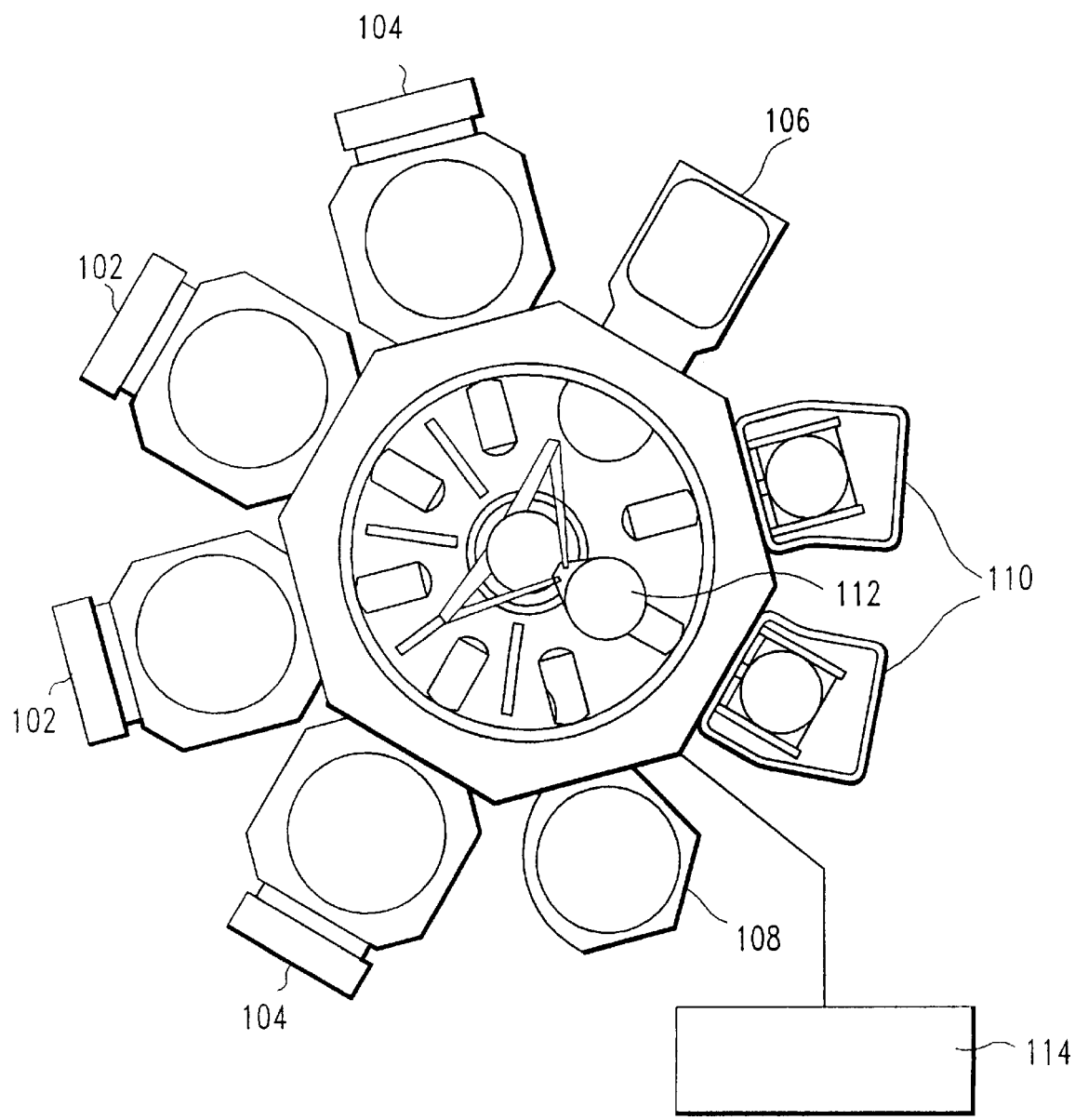
FIG. 1 is a cross-sectional schematic of an Applied Materials' CENTURA® etch system, which is a multi-chambered etch processing apparatus useful in the present invention.

In the U.S. patent applications referenced in the Background Art section of this application, there are descriptions of methods for the patterned etching of copper which avoid corrosion of the copper surface during the etching process. This is particularly important for feature sizes less than about 0.5 $\mu$m, where presence of even a limited amount of a corrosive agent can eat away a large portion of the etched copper feature. To avoid the trapping of reactive species which can act as a corrosive agent interior of the etched copper surface, either the etching is done in an environment where physical bombardment of the copper surface is the principal means of etching, or a high concentration of hydrogen is applied to that copper surface as it is etched, to protect the copper surface from the deposition of halogen-comprising compounds. Hydrogen is adsorbed on the copper exterior surface and may be absorbed into the exterior surface of the copper, so that it is available to react with halogen-comprising species on the etched copper surface.

Upon completion of the patterning etch step using one of the methods proposed for reducing corrosion, the etched copper surface is relatively free from corrosion-generating contaminants such as halogen residues. However, we have discovered that even trace amounts of such halogen residues can induce significant corrosion of the etched copper surface if the copper surface is allowed to stand exposed to an ambient which serves as a source of carbon and oxygen.

I. DEFINITIONS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor.

Specific terminology of particular importance to the description of the present invention is defined below.

The term "aspect ratio" includes but is not limited to the ratio of the height dimension to the width dimension of particular feature. For example, a via opening which typically extends in a tubular form through multiple layers has a height and a diameter, and the aspect ratio would be the height of the tubular divided by the diameter. It is the minimum width dimension of a feature which is typically used to calculate the aspect ratio.

The term "bias power" refers to the power applied to a substrate, typically to control ion bombardment energy and the directionality of ions toward a substrate.

The term "copper" refers to copper and alloys thereof, wherein the copper content of the alloy is at least 80 atomic % copper. The alloy may comprise more than two elemental components.

The term "decoupled plasma source" or "inductively coupled plasma source" refers to a plasma etch apparatus which has separate controls for power input to a plasma source generator and to a substrate bias device. Typically, a plasma source controller controls the supply of inductively coupled RF power which determines plasma density (source power) and a bias controller controls the supply of inductively coupled RF power or DC power which is used to generate a bias voltage on the semiconductor substrate surface (bias power).

The term "downstream plasma" refers to, but is not limited to, a plasma which is produced at a location other than directly above the substrate surface and species from the plasma are transported to the substrate surface which is "downstream" of the location at which the plasma is generated.

The term "feature" includes but is not limited to various device structures which make up the substrate. During semiconductor processing, the features are frequently evidenced in the topography of the substrate surface.

The term "glow discharge sputtering" includes but is not limited to a mechanism in which atoms are dislodged from a surface which is to be sputtered, by collision with high energy particles which are generated by a glow discharge, where the glow discharge is a self-sustaining type of plasma. The high energy particles may be energetic atoms as well as energetic molecules.

The term "high density plasma" typically refers to, but is not limited to, a plasma having an electron density of at least $10^{11}$ $e^-/cm^3$".

The term "plasma" includes but is not limited to a partially ionized gas containing an equal number of positive and negative charges, as well as some other number of non-ionized gas particles.

The term "source power" refers to the power used to generate ions and neutrals whether directly in an etching chamber or remotely as in the case of a microwave plasma generator.

The term "substrate" includes semiconductor materials, glass, ceramics, polymeric materials, and other materials of use in the semiconductor industry.

II. AN APPARATUS FOR PRACTICING THE INVENTION

Although any equipment capable of carrying out the processing methods described herein may be used, the preferred embodiment substrates described below were post-etch treated in a Centura® Integrated Processing System available from Applied Materials, Inc. of Santa Clara, Calif. The system is shown and described in U.S. Pat. No. 5,186,718, the disclosure of which is hereby incorporated by reference. FIG. 1 shows a cross-sectional schematic of an Applied Materials' CENTURA® etch system, which is a fully automated semiconductor fabrication system, employing a single-wafer, multi-chamber design which accommodates 200-mm wafers. The system includes a computer controlled process control system which executes software designed to carry out process methods described herein. The system includes a decoupled plasma source having separate controls for power to the plasma generation source and the substrate biasing means. The use of a decoupled plasma source was described by Yan Ye et al. at the Proceedings of the Eleventh International Symposium of Plasma Processing (May 7, 1996) and published in the *Electrochemical Society Proceedings* (Volume 96-12, pp. 222–233, 1996).

As shown in FIG. 1, the CENTURA® DPS™ etch system includes plasma processing chambers 102 having a decoupled plasma source; advanced strip-and-passivation (ASP) chambers 104; wafer orienter chamber 106; cooldown chamber 108; and independently operated load-lock chambers 110. The computer controlled process control system 114 may include a hard disk programmed to carry out the method of the present invention, or the system may be designed to accept software in the form of a floppy disk, optical disk, or other media.

Figure 2A:
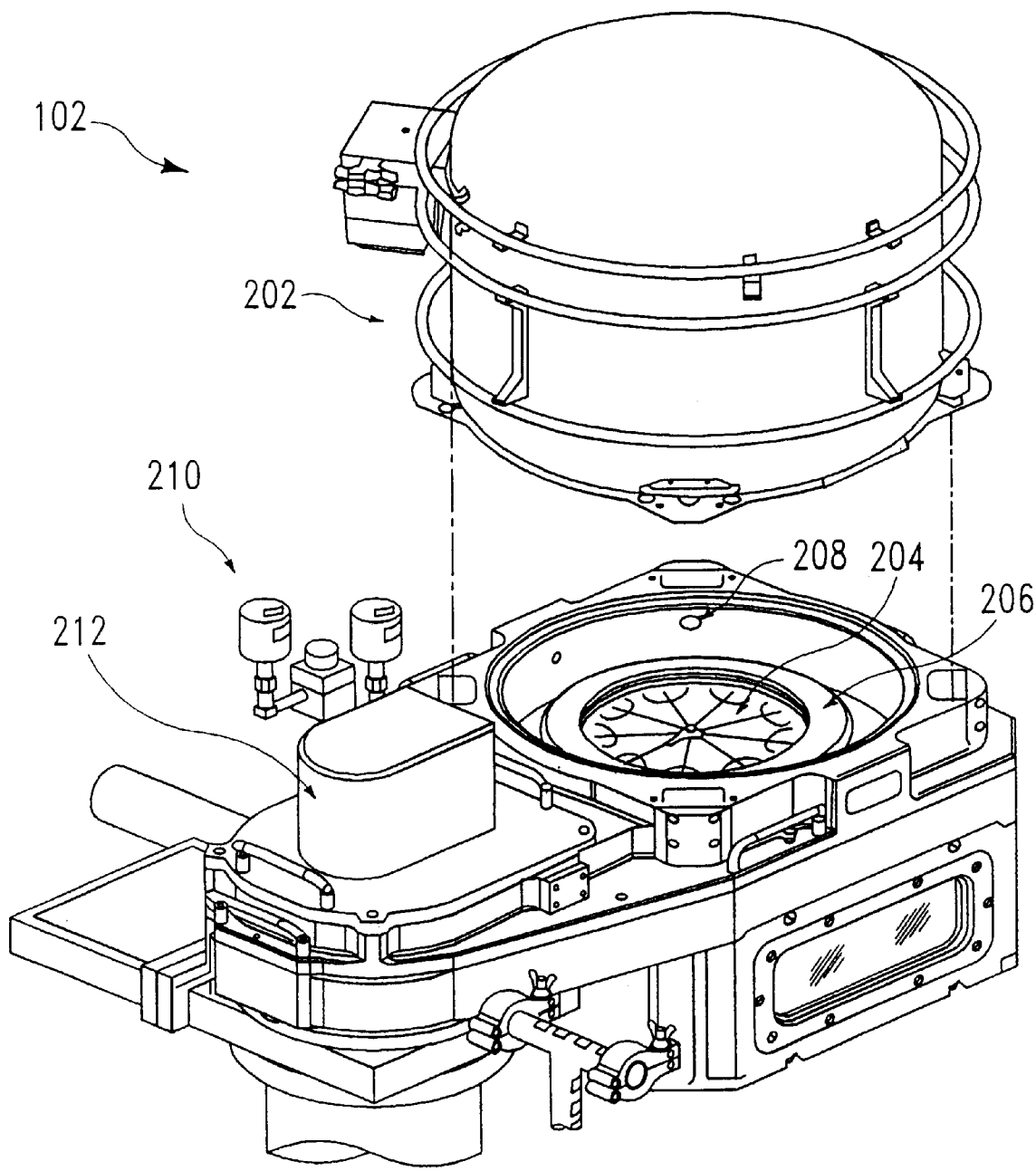
FIG. 2A is a detailed three-dimensional schematic of an individual metal etch chamber which includes a decoupled plasma source of the type used in the Applied Materials' CENTURA® DPS™ etch system shown in FIG. 1. This process chamber can be used for both etching of the metal-comprising feature and for post-etch treatment of the etched surface.

FIG. 2A shows a three-dimensional schematic of an individual metal etch chamber 102 of the type used in the CENTURA® DPS™ etch system. The metal etch chamber 102 includes a ceramic dome 202, a standard monopolar electrostatic chuck (ESC) 204, and a 1.0-inch focus ring 206. The dome 202 is maintained at a constant temperature to control the formation of particulates during processing. Gas is introduced into the chamber via four ceramic gas injection nozzles 208 for uniform gas distribution. Chamber pressure is controlled by a closed-loop pressure control system 210 with a unique plunger-style throttle valve 212.

The etch chamber 102 uses an inductive plasma source, frequency tuned at approximately 2 MHZ, to generate and sustain a high density plasma (i.e., having an electron density of at least $10^{11}$ $e^-/cm^3$). The wafer is biased with a 13.56 MHZ RF power source. The decoupled nature of the plasma source allows independent control of ion energy and ion density, which provides highly uniform plasma (<5% variation) with a wide process window over changes in source and bias power, pressure, and metal etch gas chemistry.

Figure 2B:
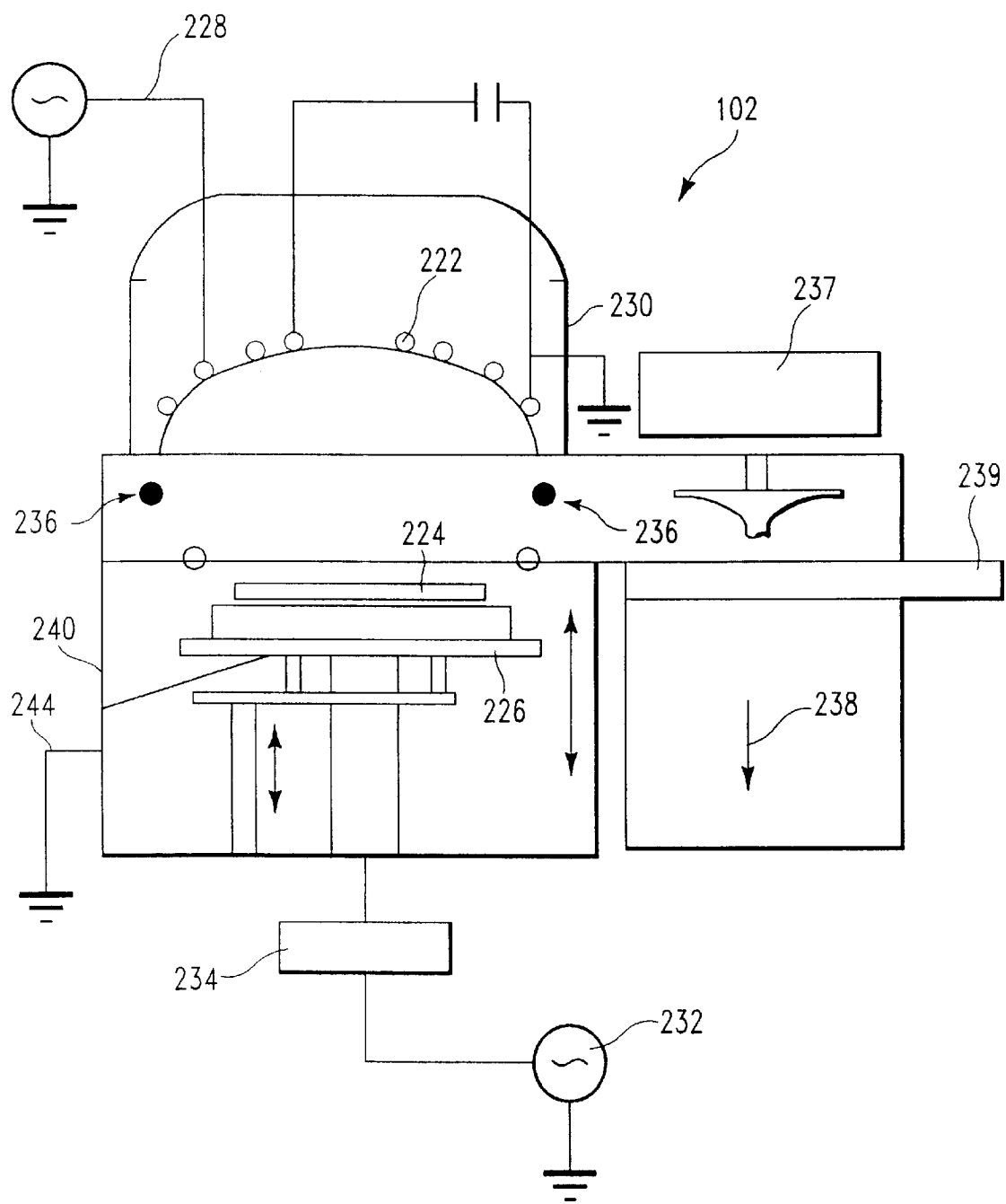
FIG. 2B is a cross-sectional schematic of an individual metal etch decoupled plasma source chamber of the type shown in FIG. 1.

FIG. 2B is a vertical cross-sectional schematic of an individual metal etch chamber 102, which is constructed to include at least one inductive coil antenna segment 222 positioned exterior to a dielectric, shaped ceiling 230, and connected to a radio frequency (RF) power generator 228. Interior to the process chamber is a substrate 224 support pedestal 226 which is connected to an RF frequency power generator 232 through an impedance matching network 234, and a conductive chamber wall 240 which serves as the electrical ground 244 for the offset bias which accumulates on the substrate 224 as a result of RF power which is typically applied to the substrate support pedestal 226.

In one of the preferred embodiments of the post-etch treatment of the present invention, the post-etch treatment is carried out in the metal etch chamber 102 immediately after completion of etch of a copper feature. In that instance, semiconductor substrate 224 remains on the support pedestal 226 after etching and gaseous components which make up a reactive gas for the post-etch treatment or a plasma source gas for a post etch treatment plasma are fed into the process chamber 102 through entry ports 236. For a post-etch treatment plasma, the source gas may be fed into etch chamber 102 without extinguishing the plasma at the completion of the copper etch step. Or, the plasma may be extinguished at the end of the etch step and a new plasma ignited at the beginning of the post-etch treatment. A plasma is ignited in process chamber 102 using techniques well known in the industry.

Pressure interior to the post-etch treatment process chamber 102 is controlled using a vacuum pump (not shown) and a throttle valve 237 used in combination with a gate valve 239 connected to a process chamber gas exit line 238. The temperature on the surface of the post-etch treatment process chamber walls is controlled using liquid-containing conduits (not shown) which are located in the walls of the chamber 102. For experimental purposes, it was desired to maintain the substrate temperature above about 200° C. and below about 400° C., and this was accomplished by a resistance heater embedded inside support pedestal 226. The interior surface of the process chamber 102 walls was maintained at about 80° C. using the cooling conduits previously described.

When it is desired to increase the percentage of the post-etch treatment plasma species which are ions at the time they strike the substrate surface, the apparatus described above may be modified so that the inductive coil used to generate a plasma is located internal to rather than external to the process chamber. An etch chamber where the external inductive coil has been replaced by an internal inductive coil is described in detail in U.S. patent application Ser. No. 08/869,798 of Yan Ye et al., titled: "RF Plasma Etch Reactor With Internal Inductive Coil Antenna And Electrically Conductive Chamber Walls", filed Jun. 5, 1997 and is further described in a continuation-in-part of that application, Ser. No. 09/158,563, filed Sep. 22, 1998, both of which applications are assigned to the assignee of the present application; these patent applications are hereby incorporated herein by reference in their entirety. In particular, the apparatus is an RF plasma etch reactor having an etch chamber with electrically conductive walls and a protective layer forming the portion of the walls facing the interior of the chamber. The protective layer prevents sputtering of material from the chamber walls by a plasma formed within the chamber. The etch reactor also has an inductive coil antenna disposed within the etch chamber which is used to generate a plasma by inductive coupling. Like the chamber walls, the inductive coil antenna is conducted to prevent sputtering of the material making up the antenna by the plasma. The coil antenna may have a tubular structure with a hollow interior channel which channel is used to sustain a flow of coolant fluid therethrough, whereby the antenna can be maintained within a prescribed temperature range.

FIG. 3 illustrates a cross-sectional schematic of an individual post-etch treatment chamber which includes an external microwave-generated plasma source. This process chamber is representative of an advanced strip and passivation (APS) chamber 104 of the kind described with reference to FIG. 1. The post-etch treatment of the present invention may be carried out in an APS chamber 104 as an alternative to using the decoupled plasma source chamber 102. APS chamber 104 includes a species application tube 304 into which the plasma source gas is fed. The microwave source 306 is applied to the area around the species application tube 304 to create a plasma 305 in tube 304. Reactive species from the plasma 305 flow from species application tube 304 into a species distribution device including upper gas plate 308 and lower gas plate 310 which includes openings through which the reactive species 312 are distributed over the surface of heated pedestal 314 (heated by heating element 318) upon which a semiconductor substrate (not shown) sits during treatment. Spent treatment gases exit through opening 316 which includes a valve (not shown) and is connected to a vacuum pump. The post-etch treatment carried out in APS chamber 104 will typically be similar to and may be essentially the same as that described with reference to an etch chamber 102 which typically includes a decoupled plasma source.

III. POST-ETCH TREATMENT OF AN ETCHED COPPER FILM

FIGS. 4A through 4C show a schematic of a cross-sectional view of an etch stack as it processes through a series of process steps in the etching of a copper layer into patterned lines and spaces. FIG. 4A shows the etch stack 400 comprising a silicon dioxide substrate 402 having a first barrier tri-layer of Ta/TaN/Ta 204 which is overlaid by a layer of copper 406. Overlying the copper layer 406 is second barrier tri-layer of Ta/TaN/Ta 408, which is overlaid by a silicon oxide hard masking layer 410 and a patterned photoresist layer 412. The pattern in photoresist layer 412 is one of lines 413 and spaces 414. FIG. 4B shows etch stack 400 after transfer of the pattern from patterned photoresist layer 412 to silicon oxide hard masking layer 410 and removal of any residual photoresist layer 412. FIG. 4C shows etch stack 400 after transfer of the pattern from hard masking layer 410 through second barrier tri-layer 408, copper layer 406, and first barrier tri-layer 404, down to the surface 405 of silicon oxide substrate 402. The patterned copper etching methods described in the patent application previously referenced can be used to carry out the patterned etching of the copper layer 406 in a manner which avoids penetration of corrosion-causing halogen species to the interior of etched copper lines 416 and which reduces the amount of halogen-comprising residue which remains on the surfaces 417 of lines 416.

Figure 5A:
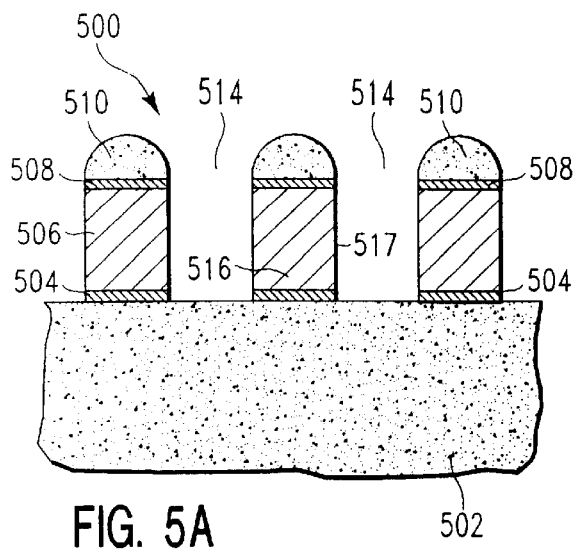
FIGS. 5A and 5B show a schematic of a cross-sectional view of a pattern-etched copper layer as it emerges from the FIG. 4C pattern-etching step, and as it corrodes upon exposure to ambient environment, respectively.
Figure 5C:
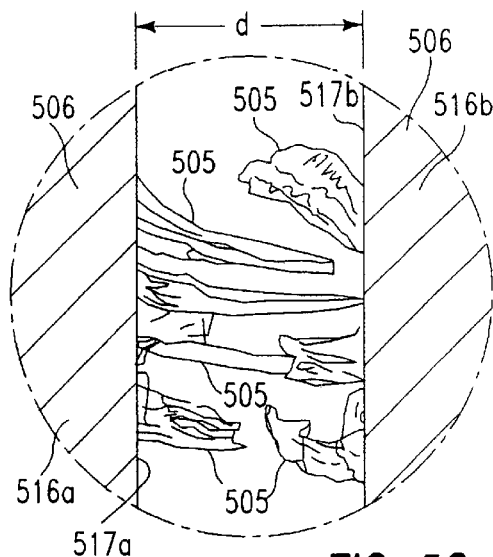
FIG. 5C shows an enlarged side view of the corroded FIG. 5B pattern-etched copper layer.
Figure 5B:
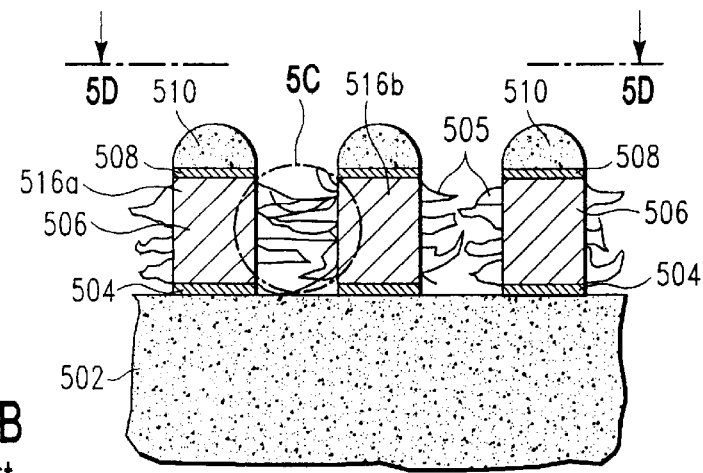
Figure 5D:
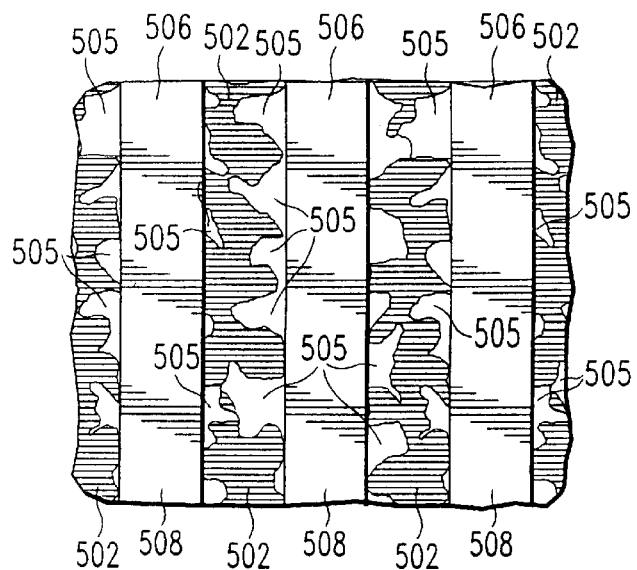
FIG. 5D shows a schematic of a top view of the corroded, pattern-etched copper layer of FIG. 5B.

FIG. 5A shows a schematic of a cross-sectional view of an etched structure 500 including a pattern of lines and spaces of the kind etched using the steps shown in FIG. 4C. The substrate 502 is a silicon oxide, the first barrier layer 504 is the tri-layer of Ta/TaN/Ta previously described, the etched copper layer 506 is patterned into lines 516 having etched copper surfaces 517. A second tri-layer barrier 508 overlies copper lines 516, and a residue of hard masking silicon oxide 510 overlies second tri-layer barrier 508. If the etched structure 500 is exposed to ambient conditions, corrosive growths (dendrites) 505 of the kind shown on FIG. 5B begin to form on the surface 517 of etched copper lines 516. FIG. 5C is an enlargement of a portion of the cross-sectional view of surfaces 517 of copper lines 516, to show the dendrites 505 better. Some of these dendrites 505 span the entire distance "d" between the adjacent surfaces 517a of copper line 516a and 517b of copper line 517b, creating a bridge between these two different copper lines. Since the bridge is of a conductive material, an interconnect structure of such copper lines cannot function as intended. FIG. 5D is a top view of the pattern of lines and spaces shown in FIG. 5B, but with the silicon oxide hard masking material 510 removed. The top surface of the lines is that of the second tri-layer barrier 508. Extending outward from the copper line 506 beneath tri-layer barrier 508 are the dendrites 505, shown against the background of silicon oxide substrate 502. FIGS.

5B through 5D are schematics of actual photomicrographs of a patterned etched copper film of 0.25 µm wide lines and spaces. The pattern etched film had been exposed to ambient room temperature conditions for a time period of 30 hours.

Figure 6A:
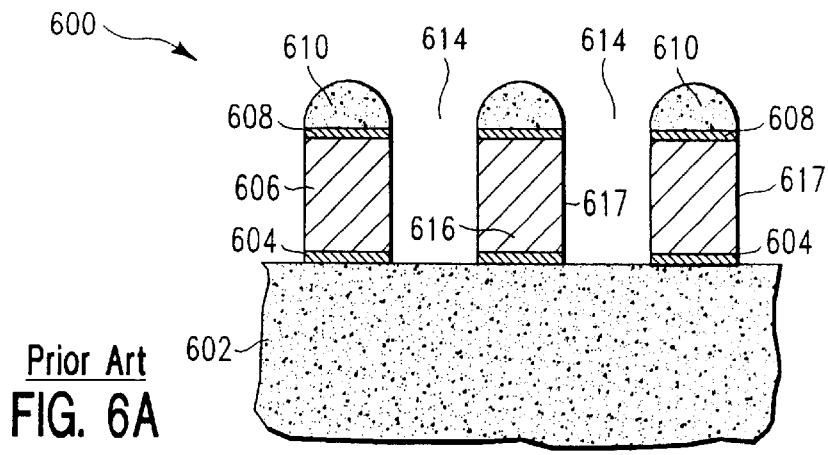
FIGS. 6A through 6C show schematics of actual photomicrograph cross-sectional views of pattern-etched copper lines and spaces after the post-etch treatment of the present invention and subsequent exposure to ambient environment for a period of 30 hours.
Figure 6B:
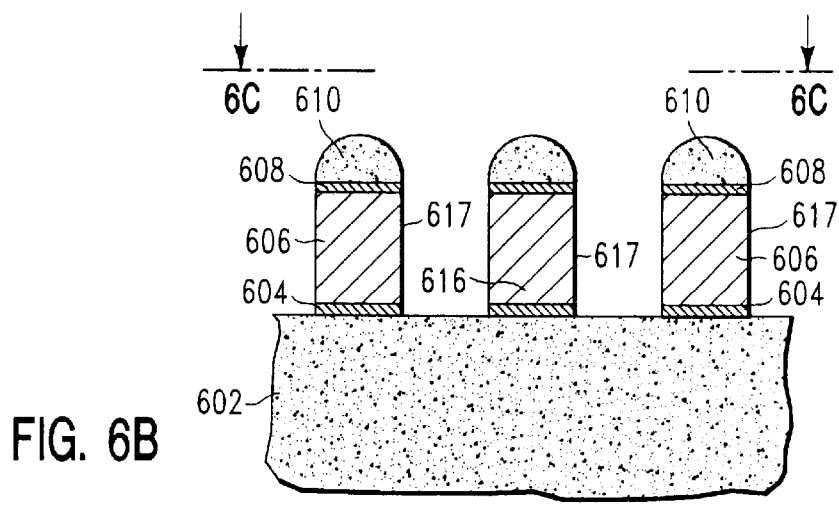
Figure 6C:
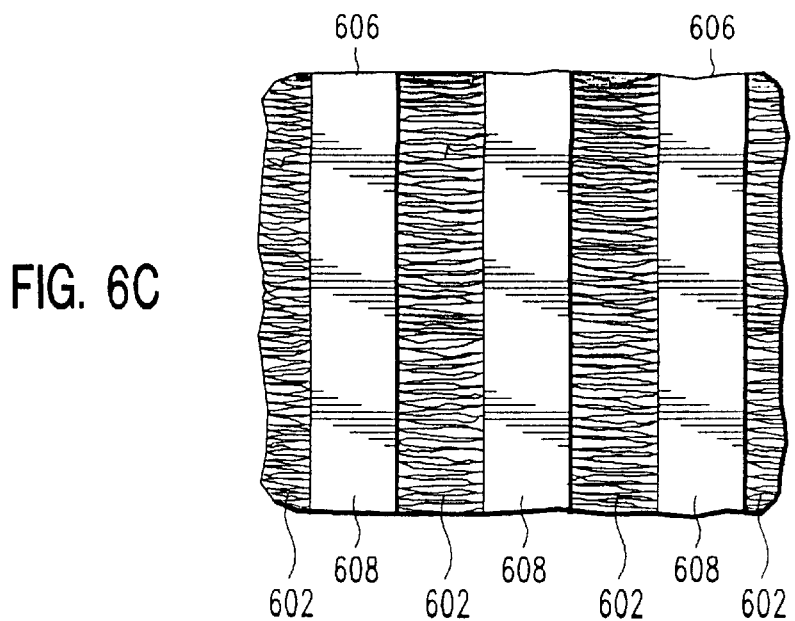

FIG. 6A shows a schematic of a cross-sectional view of an etched structure 600 including a pattern of lines and spaces of the kind shown in FIG. 5A. The substrate 602 is a silicon oxide, the first barrier layer 604 is the tri-layer of Ta/TaN/Ta previously described, the etched copper layer 606 is patterned into lines 616 having etched copper surfaces 617. A second tri-layer barrier 608 overlies copper lines 616, and a residue of hard masking silicon oxide 610 overlies second tri-layer barrier 608. The etched structure shown in FIG. 6A was post-etch treated as described below. After the post-etch treatment, the etched structure was subjected to more than 70 hours in a saturated water box at 25° C., and ambient air at 100% relative humidity, no corrosion of copper line 616 surfaces 617 was observed, as shown in FIG. 6B. A top view of the etched structure as shown in FIG. 6C shows no dendrites. FIGS. 6A through 6C are schematics of actual photomicrographs of a patterned etched copper film of 0.25 um wide lines and spaces.

A patterned structure 600 as shown in FIG. 6A was post-etch treated in the same process chamber in which copper layer 606 was pattern etched to form copper lines 616 and spaces 614. The temperature of the patterned structure 400 was maintained at approximately 200° C. while a post-etch treatment gas flow (of 100 sccm of NH$_3$ and 1,000 sccm of N$_2$) was initiated to the process chamber and the copper etch source gas flow (of 100 sccm Ar; 50 sccm HCl; 5 sccm BCl$_3$; and 20 sccm N$_2$) was turned off. This occurred over a transition time period of approximately 5 seconds.

The post-etch treatment was as follows: A plasma was created in the etch chamber using standard techniques, with the composition of the post-etch treatment plasma source gas being 100 sccm of NH$_3$ and 1,000 sccm of N$_2$. With reference to FIG. 2B, the plasma source power to the power to the external RF coil 222 was 1500 W at a frequency of about 2 MHZ. No bias power was applied to the substrate support platen 226 to create an offset bias. However, there was a self bias on the substrate (patterned structure 400) of about 10 eV. The pressure in the post-etch treatment chamber was 50 mT. Although the post-etch treatment pressure has not yet been optimized, we know that 50 mT provides better results than either 1 mT or 100 mT. The temperature of the substrate surface during post-etch treatment was about 250° C. (The temperature of the substrate will typically be that at the end of the copper etch step when the post-treatment is carried out in the etch process chamber, i.e. "in-situ". However ion bombardment of the substrate surface or heating lamps may be used to rapidly increase substrate surface temperature, if desired.) In instances were the post-treatment of the etched surfaces is carried out in a separate "passivation and strip" chamber, the temperature of the substrate may be adjusted upon transfer to that chamber. Typically the post-etch treatment chamber wall temperature was preferably at least 50 degrees lower than the substrate temperature, although the precise chamber wall temperature is not critical.

When the plasma is a microwave-generated downstream plasma which is used in an ASP chamber, the pressure in the process chamber will be higher, typically ranging from about 1 Torr to about 10 Torr.

Although particular process conditions are provided for the example preferred embodiment provided above, the general ranges typically used for a plasma-comprising post etch treatment are as follows.

A plasma generated in the post-etch treatment process chamber, which is preferably the DPS™ etch chamber, is typically generated at a chamber pressure ranging between about 10 mT and about 100 mT, more preferably between about 25 mT and about 75 mT, and most preferably at about 50 mT. The plasma source power for an internally-generated plasma in the CENTURA® DPS™ chamber previously described preferably ranges from about 1,000 W to about 3,000 W. There is no bias power applied, or the bias power is generally less than about 200 W. The plasma source gas flow rate ranges from about 100 sccm to about 1,000 sccm, and preferably from about 100 sccm and 500 sccm. The substrate temperature during treatment typically ranges from about 200° C. to about 400° C.

When the plasma is a downstream plasma, such as a microwave-generated plasma, for example, and species from the plasma are fed into the post-etch treatment process chamber, as illustrated in FIG. 3, the process chamber pressure typically ranges from about 100 mT to about 10 Torr, and more typically is between about 1 Torr and about 10 Torr. The microwave power is in the range of about 1,500 W to 3,000 W. For a process chamber having a volume of about 8,200 cubic centimeters (500 cubic inches), the plasma gas feed rate ranges from about 1,000 sccm to about 10,000 sccm, and preferably from about 1,000 sccm to about 5,000 sccm. The substrate temperature during treatment typically ranges from about 200° C. to about 350° C.

An alternative to the use of a post-etch plasma treatment is the use of reactive gas feed in the absence of a plasma. For example, with reference to the CENTURA® etch chamber previously described, a gas feed of about 2,000 sccm of NH$_3$ or H$_2$ is typically used in combination with an inert gas which assists in dissociation of the feed gas and increases the overall flow rate through the process chamber. The reactive gas feed gas enters the process chamber which is maintained at a pressure in the range of about 2 Torr. The gas feed is contacted with the substrate which is at a temperature ranging from about 200° C. to about 400° C., and which is preferably at about 250° C. for a time period of about three minutes. Subsequently, the substrate is removed from the gas treatment chamber to a finishing chamber where it is rinsed with deionized water, spun dry, and oven baked under an inert atmosphere at a temperature of about 100° C. for a time period of about five minutes.

The prevention of corrosion requires not only an affirmative post-etch treatment of the kind described above, but also requires careful handling of the substrate after the end of the etch process and prior to the affirmative post-etch treatment, as previously described.

Copper tends to corrode more easily than aluminum, tungsten, and other metals used to provide electrical contacts and conductive interconnects. With regard to copper, we have discovered that (in contrast with the prior art which teaches that corrosion of a metal-comprising plasma etched surface occurs in proportion to the amount of residual halogens on the etched surface) even trace amounts of residual halogens can produce a substantial degree of corrosion. We have investigated this surprising discovery and concluded that the trace amount of residual halogen compounds changes the pH on the etched surface so that, in the presence of moisture, carbon and oxygen compounds are extracted from ambient air to form carbonic acid on the etched surface of the metal-comprising feature. When the etched feature is copper, the carbonic acid reacts with the copper to produce copper carbonate which appears in the form of the dendrites previously described. We have observed that if the etched copper surface is kept free of moisture, there is no corrosion. When we do observe corrosion, we find that analysis of the corrosion compound shows the presence of copper, carbon, and oxygen. To avoid the formation of copper carbonate dendrites, it is advisable to avoid the presence of moisture on the etched copper surface until after the post-etch treatment of the present invention. If it is not possible to avoid the formation of a monolayer of moisture on the etched copper surface, it is advisable to avoid the presence of sources of carbon and oxygen source until after the post-etch treatment. Once the residual halogen-comprising compounds are removed, the etched copper surface can safely be exposed to moisture and to air with no adverse consequences for at least 70 hours, as indicated by our test data.

The above described preferred embodiments are not intended to limit the scope of the present invention, as one skilled in the art can, in view of the present disclosure, expand such embodiments to correspond with the subject matter of the invention claimed below.

We claim:

1. A post-etch treatment method for reducing the corrosion of an etched metal-comprising surface of a semiconductor feature, said method comprising the steps of:

a) reducing formation of corrosion-inducing species on the surface of an etched feature subsequent to substantial completion of etching of the feature and prior to an affirmative post-etch treatment to remove residues on a surface of the etched feature;

b) contacting said etched feature surface with a plasma including at least one hydrogen-comprising species which is in a kinetic state permitting reaction with residual halogen-comprising residues on said etched feature surface; and c) removing step b) reaction products from said etched feature surface.

2. The method of claim 1, including an additional step subsequent to step c):

d) applying a deionized water rinse to said etched feature surface.

3. The method of claim 1, wherein said formation of corrosion-inducing species is reduced by reducing the formation of moisture on said etched feature surface.

4. The method of claim 3, wherein said metal-comprising surface is a copper-comprising surface.

5. The method of claim 4, wherein said corrosion of said etched feature surface is further reduced by reducing contact of said etched feature surface with reactive species which form copper carbonates.

6. The method of claim 4, wherein said corrosion of said etched feature surface is further reduced by reducing contact of said etched feature surface with reactive species which form copper sulfates.

7. The method of claim 2, wherein said formation of corrosion-inducing species in step a) is reduced by reducing the formation of moisture on said etched feature surface prior to step c) of said method.

8. The method of claim 7, wherein said metal-comprising surface is a copper-comprising surface.

9. The method of claim 8, wherein said corrosion of said etched feature surface is further reduced by reducing contact of said etched feature surface with reactive species which form copper carbonates.

10. The method of claim 8, wherein said corrosion of said etched feature surface is further reduced by reducing contact of said etched feature surface with reactive species which form copper sulfates.

11. The method of claim 1, or claim 3, or claim 4, or claim 5, or claim 6, wherein said post-etch treatment method is carried out in the same process chamber as that used for etching said metal-comprising feature.

12. The method of claim 1 or claim 4, wherein said post-etch treatment method is carried out as soon after said etching of said metal-comprising feature as is reasonably possible.

13. The method of claim 3, wherein said formation of moisture on said etched surface is reduced by controlling a temperature of said etched surface.

14. The method of claim 3, or claim 9, or claim 10, or claim 13, wherein an inert, non-reactive purge gas is flowed over said etched surface.

15. The method of claim 3, or claim 9, or claim 10, or claim 13, wherein a pressure in a process chamber in which said post-etch treatment method is carried out is about 100 mTorr or less.

16. The method of claim 14, wherein a pressure in a process chamber in which said post-etch treatment method is carried out is about 100 mTorr or less.

17. An apparatus for carrying out the method of claim 1 or claim 3, wherein said apparatus includes at least one plasma processing chamber and a process control system which operates in combination with said plasma processing chamber, wherein said process control system is programmed to carry out steps of said method.

18. A medium containing data which is used in combination with a process control system which operates in combination with at least one plasma processing chamber to carry out of the method of claim 1 or claim 3.

19. A post-etch treatment method for reducing the corrosion of an etched metal-comprising surface of a semiconductor feature, said method comprising the steps of:

a) reducing formation of corrosion-inducing species on the surface of an etched feature subsequent to substantial completion of etching of the feature and prior to an affirmative post-etch treatment to remove residues on a surface of the etched feature;

b) contacting said etched feature surface with at least one hydrogen-comprising reactive species which is in a kinetic state permitting reaction of said hydrogen with residual halogen-comprising residues on said etched feature surface; and c) removing step b) reaction products from said etched feature surface.

20. The method of claim 19, including an additional step subsequent to step c):

d) applying a deionized water rinse to said etched feature surface.

21. The method of claim 19, wherein said formation of corrosion-inducing species is reduced by reducing the formation of moisture on said etched feature surface.

22. The method of claim 21, wherein said metal-comprising surface is a copper-comprising surface.

23. The method of claim 22, wherein said corrosion of said etched feature surface is further reduced by reducing contact of said etched feature surface with reactive species which form copper carbonates.

24. The method of claim 23, wherein said corrosion of said etched feature surface is further reduced by reducing contact of said etched feature surface with reactive species which form copper sulfates.

25. A medium containing data which is used in combination with a process control system which operates in combination with at least one plasma processing chamber to carry out of the method of claim 19 or claim 21.

26. The method of claim 19, or claim 21, wherein said post-etch treatment method is carried out in the same process chamber as that used for etching said metal-comprising feature.

27. A method of reducing formation of corrosion-inducing species on the surface of an etched feature subsequent to substantial completion of etching of feature and prior to an affirmative post-etch treatment to remove etch residues from a surface of said feature, comprising: reducing the formation of moisture on said surface of said feature prior to said post-etch treatment.

28. The method of claim 27, wherein said moisture formation is reduced by taking an action selected from the group consisting of: maintaining said feature surface at a temperature sufficient to prevent the formation of moisture on said feature surface, passing an inert gas over said feature surface, maintaining sufficient vacuum surrounding a feature surface to prevent the formation of moisture on said feature surface, and a combination thereof.

29. The method of claim 27, followed by a post-etch treatment step including contacting of said etched feature surface with a plasma including at least one hydrogen-comprising species which is in a kinetic state permitting reaction with residual halogen-comprising residues on said etched feature surface, and removing from said etched feature surface by-products resulting from said contacting said feature surface with said plasma.

30. The method of claim 28, followed by a post-etch treatment step including contacting of said etched feature surface with at least one hydrogen-comprising reactive species which is in a kinetic state permitting reaction of said hydrogen with residual halogen-comprising residues on said etched feature surface, and removing from said etched feature surface by-products resulting from said contacting of said feature surface with said at least one hydrogen-comprising reactive species.

* * * * *